United States Patent
Cha et al.

(10) Patent No.: US 8,053,846 B2
(45) Date of Patent: Nov. 8, 2011

(54) FIELD EFFECT TRANSISTOR (FET) HAVING NANO TUBE AND METHOD OF MANUFACTURING THE FET

(75) Inventors: Seung-Nam Cha, Yongin-si (KR); Jae-Eun Jang, Yongin-si (KR); Jae-Eun Jung, Yongin-si (KR); Yong-Wan Jin, Yongin-si (KR); Byong-Gwon Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 329 days.

(21) Appl. No.: 11/826,170

(22) Filed: Jul. 12, 2007

(65) Prior Publication Data

US 2008/0150043 A1 Jun. 26, 2008

(30) Foreign Application Priority Data

Nov. 27, 2006 (KR) .................. 10-2006-0117919

(51) Int. Cl.
*H01L 27/088* (2006.01)
(52) U.S. Cl. .......... 257/401; 257/25; 257/379; 365/151; 438/195; 438/280
(58) Field of Classification Search .................. 438/195, 438/280; 365/151; 257/368, 379, 25, 401
See application file for complete search history.

(56) References Cited

U.S. PATENT DOCUMENTS

| | | | |
|---|---|---|---|
| 5,864,163 A * | 1/1999 | Chou et al. | 257/385 |
| 6,515,339 B2 * | 2/2003 | Shin et al. | 257/368 |
| 6,528,370 B2 * | 3/2003 | Suzuki et al. | 438/257 |
| 6,730,972 B2 * | 5/2004 | Ravi et al. | 257/379 |
| 6,962,839 B2 | 11/2005 | Wei | |
| 7,476,596 B2 * | 1/2009 | Lieber et al. | 438/458 |
| 7,579,618 B2 * | 8/2009 | Adam | 257/25 |
| 2002/0163079 A1 * | 11/2002 | Awano | 257/750 |
| 2005/0212014 A1 | 9/2005 | Horibe et al. | |

(Continued)

FOREIGN PATENT DOCUMENTS

JP 2005-116618 4/2005

(Continued)

OTHER PUBLICATIONS

Sander J. Tans et al., "Room-temperature transistor based on a single carbon nanotube," Nature, vol. 393, May 7, 1998, pp. 49-52.

(Continued)

*Primary Examiner* — Wael Fahmy
*Assistant Examiner* — John C Ingham
(74) *Attorney, Agent, or Firm* — Cantor Colburn LLP

(57) ABSTRACT

A transistor includes: a semiconductor substrate; a channel region arranged on the semiconductor substrate; a source and a drain respectively arranged on either side of the channel region; and a conductive nano tube gate arranged on the semiconductor substrate to transverse the channel region between the source and the drain. Its method of manufacture includes: arranging a conductive nano tube on a surface of a semiconductor substrate; defining source and drain regions having predetermined sizes and traversing the nano tube; forming a metal layer on the source and drain regions; removing a portion of the metal layer formed on the nano tube to respectively form source and drain electrodes separated from the metal layer on either side of the nano tube; and doping a channel region below the nano tube arranged between the source and drain electrodes by ion-implanting.

26 Claims, 10 Drawing Sheets

FOREIGN PATENT DOCUMENTS

| | | |
|---|---|---|
| JP | 2006-024617 | 1/2006 |
| KR | 10-2003-0005990 | 1/2001 |
| KR | 10-2002-0039072 | 5/2002 |
| KR | 10-2002-0068029 | 8/2002 |
| KR | 10-2002-0095800 | 12/2002 |

OTHER PUBLICATIONS

Yuegang Zhang et al., "Electric-field-directed growth of aligned single-walled carbon nanotubes," Applied Physics Letters, vol. 79, No. 19, Nov. 5, 2001, pp. 3155-3157.

Digh Hisamoto et al., "FinFET-A Self-Aligned Double-Gate MOSFET Scalable to 20nm," IEEE Transactions on Electron Devices, vol. 47, No. 12, Dec. 2000, pp. 2320-2325.

Jack P. Denton et al., "Fully Depleted Dual-Gated Thin-Film SOI P-MOSFET's Fabricated in SOI Island with an Isolated Buried Polysilicon Backgate," IEEE Electron Device Letters, vol. 17, No. 11, Nov. 1996, pp. 509-511.

* cited by examiner

FIELD EFFECT TRANSISTOR (FET) HAVING NANO TUBE AND METHOD OF MANUFACTURING THE FET

CLAIM OF PRIORITY

This application makes reference to, incorporates the same herein, and claims all benefits accruing under 35 U.S.C. §119 from an application for FIELD EFFECT TRANSISTOR HAVING NANO TUBE AND METHOD OF MANUFACTURING THE FIELD EFFECT TRANSISTOR earlier filed in the Korean Intellectual Property Office on the 27 Nov. 2006 and there duly assigned Serial No. 2006-0117919.

BACKGROUND OF THE INVENTION

1. Field of the Invention

The present invention relates to a Field Effect Transistor (FET) for a semiconductor memory device or the like and a method of manufacturing the FET, and more particularly, the present invention relates to an FET having a conductive nano tube as a gate and a method of manufacturing the FET.

2. Description of the Related Art

As the integration of semiconductor devices has remarkably increased, the miniaturization of CMOS semiconductor devices having a conventional structure, that is, scaling, has reached the limits in the current technology. Scaling has been performed to reduce the width and the length of a gate, minimize an isolation area between unit elements, and reduce the thickness and the junction depth of a gate insulating layer in order to achieve high integration, high performance, and low power consumption. However, since gate controllability is basically required in this respect, an on-current off-current ratio ($I_{on}/I_{off}$) of a transistor must be substantially maximized. According to a road map of international technology road maps for semiconductors (ITRS, 2001), research has been recently conducted on a ultra-thin body fully depleted (UTB-FD) SOI transistor having a silicon-on-insulator (SOI) substrate and a band-engineered transistor {K. Rim, et al., VLSI 2002 page 12} which has improved electron mobility by using a strained Si channel in order to increase a drive current. In addition, research has been conducted on silicon transistors having various three dimensional structures, such as a vertical transistor {Oh, et al., IEDM-2000, page 65}, Fin-FET {Hisamoto, et al., IEEE Trans. On Electron Device 47, 2320 (2000)}, and double-gate transistor {Denton, et al., IEEE Electron Device Letters 17, 509 (1996)}. However, in a silicon transistor having a three dimensional gate structure, it is difficult to change the structure of a gate when manufacturing the silicon transistor in order to maximize a field effect of the gate. In particular, since silicon used for forming a channel is also used for forming a substrate or a silicon substrate with a three dimensional structure in deposition and patterning processes, a method of manufacturing a three dimensional gate structure is complicated.

A transistor having a carbon nano tube as a channel has been recently suggested for overcoming the problems of a silicon device that has reached the scaling limits. Tans and Dekker, et al. reported a carbon nano tube transistor which can be operated at a normal temperature {Tans, et al., Nature 393, 49 (1998)}. In particular, since a horizontal growth technique for a carbon nano tube {Hongjie Dai, et al., Appl. Phys. Lett. 79, 3155 (2001)} and techniques in which a carbon nano tube is vertically grown from a nano hole {Choi, et al., Adv. Mater. 14, 27 (2002); Duesberg, et al., Nano Letters} have been developed, research has been widely conducted for applying these techniques to semiconductor devices.

SUMMARY OF THE INVENTION

The present invention provides a highly integrated transistor which can be easily manufactured and a method of manufacturing the highly integrated transistor.

According to one aspect of the present invention, a transistor is provided including: a semiconductor substrate, a channel region formed on the semiconductor substrate, a source and a drain respectively formed on either side of the channel regions, and a conductive nano tube gate disposed on the semiconductor substrate and traversing the channel region between the source and the drain.

According to another aspect of the present invention, a method of manufacturing a transistor is provided, the method including: arranging a conductive nano tube on a surface of a semiconductor substrate, defining source and drain regions having a predetermined sizes and traversing the nano tube, forming a metal layer on the source and drain regions, removing a portion of the metal layer formed on the nano tube as the gate to form source and drain electrodes respectively separated from the metal layer on either side of the nano tube, and doping a channel region below the gate disposed between the source and drain electrodes by ion-implanting.

According to an embodiment of the present invention, the source and the drain regions may be defined by forming a photo-resist layer, which includes a developed window having a size and a location corresponding to a design requirement of the source and the drain on a substrate where the conductive nano tube as the gate is disposed.

The forming of the metal layer may include depositing a metal material on the photo-resist layer to form the metal layer on the source and the drain regions defined by the window, and leaving the metal layer just on the source and the drain regions by removing the photo-resist layer and a part of the metal material deposed on the photo-resist layer.

The forming of the source and the drain regions may include removing a portion of the metal layer remaining on a gate, which is formed on the source and the drain regions, to form separated source and drain electrodes respectively disposed on either side of the gate.

According to an exemplary embodiment of the present invention, a metal layer on a nano tube as well as a metal layer on the photoresist is removed by applying ultra sonication during a lift-off process to obtain a source electrode and a drain electrode separated on both sides.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully below with reference to the accompanying drawings, in which exemplary embodiments of the present invention are shown. The present invention may, however, be embodied in many different forms and should not be construed as being limited to the embodiments set forth herein. Rather, these embodiments are provided so that this disclosure will be thorough and complete, and will fully convey the concept of the present invention to those skilled in the art.

Generally, a plurality of transistors are manufactured in a plurality of arrays on a wafer. Hereinafter, a method of manufacturing a transistor will be described according to embodiments of the present invention. A common method of manufacturing the transistor having an array type will be understood based on the descriptions of the method of manufacturing the transistor, according to the present invention. A well-known process can be used in a method of manufacturing a TFT, which is not specifically described in the present invention. Accordingly, the scope of the present invention is not limited to the processes described in the embodiments of the present invention.

According to the present invention, a PNP or NPN-type transistor can be obtained. Such a selection of a transistor is well known art. A transistor is selected according to the types of a substrate (wafer) and dopant used in the manufacturing process. Hereinafter, and NPN-type transistor having an N-type substrate and a method of manufacturing the NPN-type transistor are described.

Figure 1:
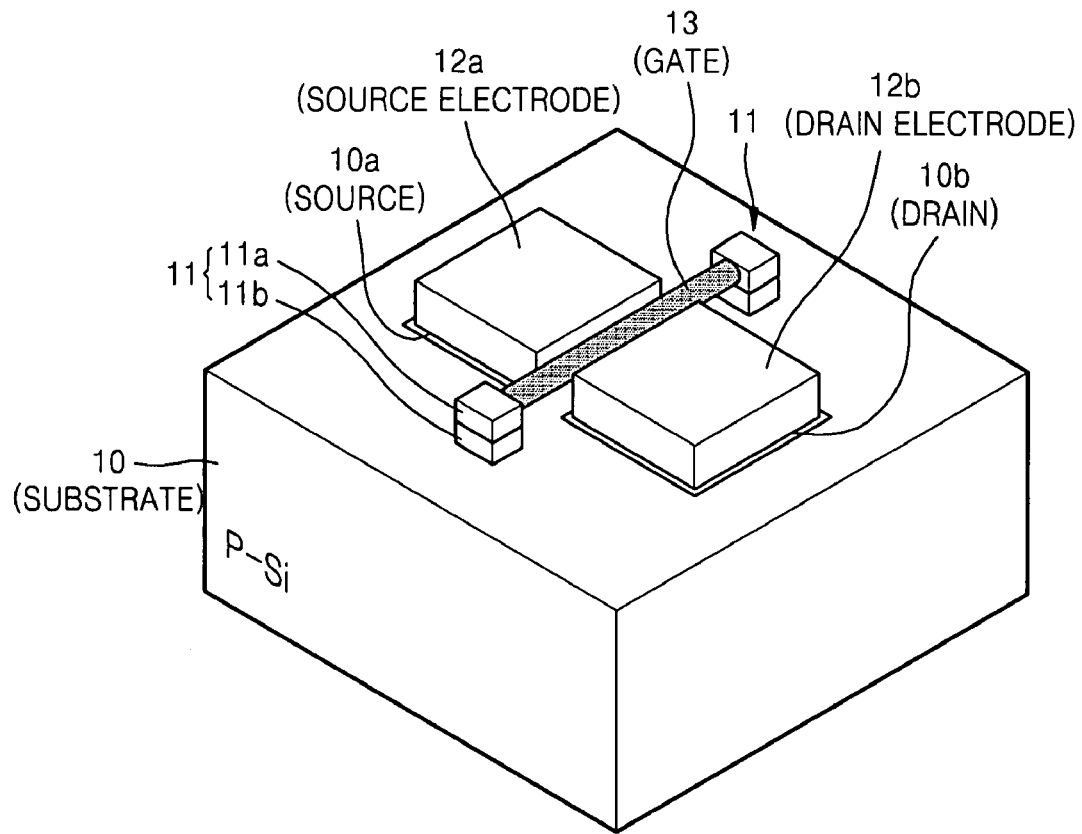
FIG. 1 is a schematic perspective view of a Field Effect Transistor (FET) according to an embodiment of the present invention.
Figure 2:
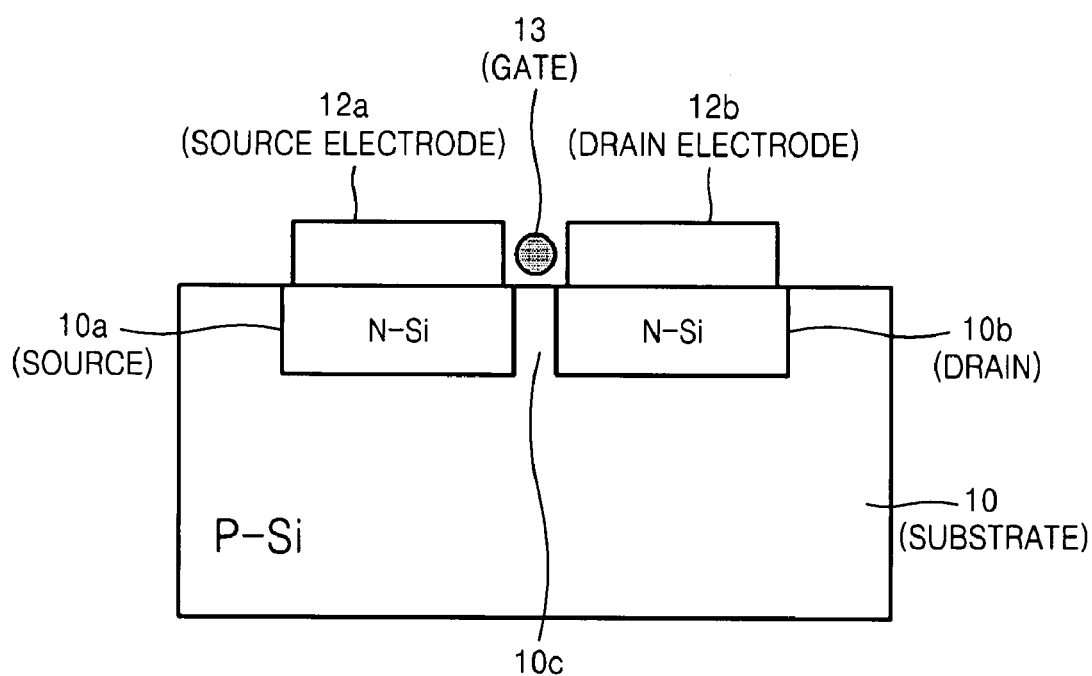
FIG. 2 is a schematic cross-sectional view of a schematic structure of the FET of FIG. 1.

FIGS. 1 and 2 are respectively a perspective view and a cross-sectional view of a schematic structure of a Field Effect Transistor (FET) according to an embodiment of the present invention.

Referring to FIGS. 1 and 2, a source electrode 12a and a drain electrode 12b are arranged to have a narrow gap therebetween on a P-type silicon substrate 10. A gate 13 formed of a conductive nano tube is disposed between the source electrode 12a and the drain electrode 12b. The gate 13 is disposed parallel to a surface of the p type silicon substrate 10, and is supported by structures 11 formed on both sides of the gate 13. The gate 13 is suspended while being separated from the substrate 10. An N-type source 10a and an N-type drain 10b are disposed below the source electrode 12a and the drain electrode 12b. A gap and the length of a channel between the source electrode 12a and the drain electrode 12b are determined according to the diameter of the conductive nano tube gate 13 in a method of manufacturing a transistor according to the present invention, which will be described later.

Although in the present embodiment, the source 10a and the drain 10b are described as being of N-types, and a channel 10c between the source 10a and the drain 10b and the substrate 10 is described as being of a P-type, the source 10a and the drain 10b may be of P-types, and the channel 10c between the source 10a and the drain 10b and the substrate 10 may be of N-types in other embodiments of the present invention.

According to the present invention, a nano tube is used as a gate, which is a characteristic feature of the transistor according to the present invention. Accordingly, high-density memory devices can be manufactured by reducing the length of a channel. According to the present invention, since a gate is manufactured by growing a nano tube using an epitaxy method, a gate having a fine critical dimension can be obtained. Accordingly, unlike a conventional photolithography manufacturing method, a gate having a very narrow width (diameter) can be obtained without a process limitation due to manufacturing equipment.

Hereinafter, a method of manufacturing a FET according to an embodiment of the present invention is sequentially described.

Figure 3A:
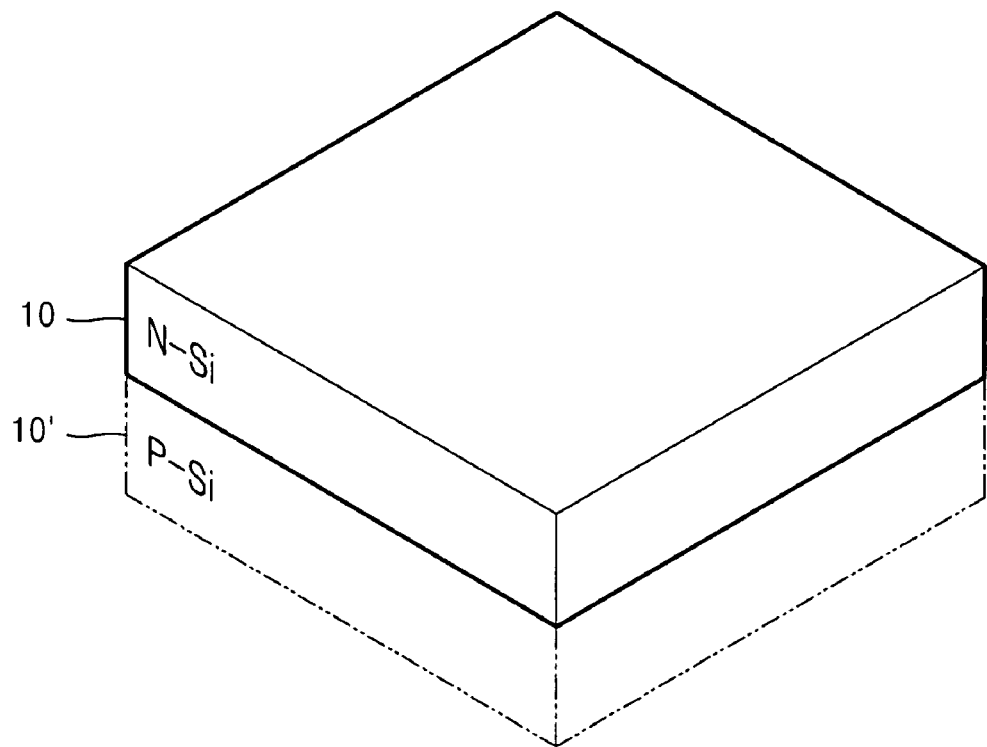
FIGS. 3A through 3J are views of a method of manufacturing a FET, according to an embodiment of the present invention.

Referring to FIG. 3A, an N-type substrate 10 is prepared. The N-type substrate 10 may be supported by a P-type substrate 10' which is indicated by a dotted line below the N-type substrate 10. The N-type substrate 10 may correspond to an N-type well formed by implanting N-type impurities in a predetermined region of the P-type substrate 10'. This is well know in the art of the present invention, and thus has not been described in detail.

Figure 3B:
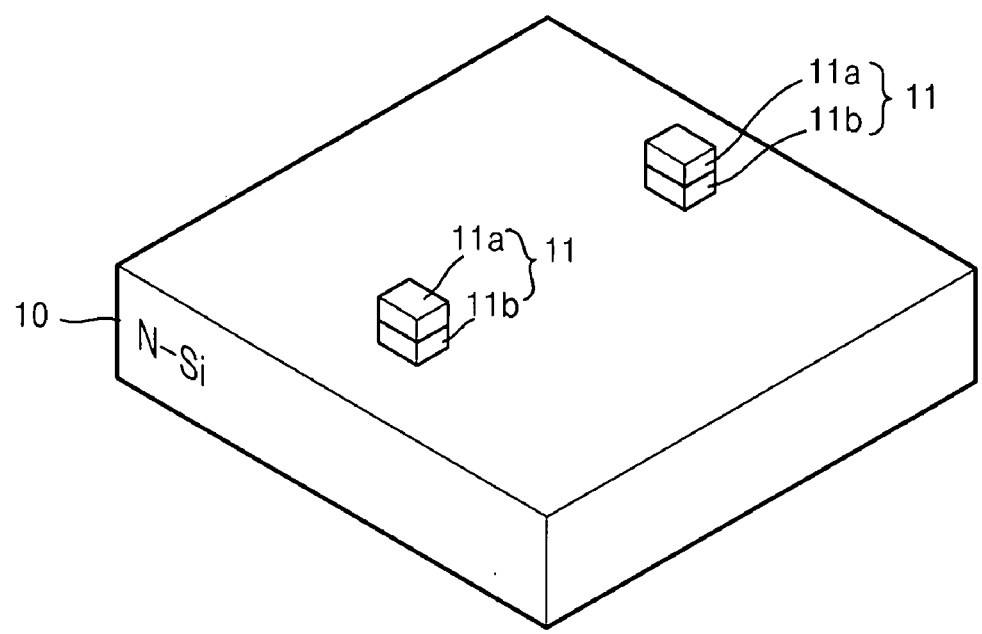

Referring to FIG. 3B, nano tube horizontal growth structures 11 and 11 are formed on the N-type substrate 10. Each of the nano tube horizontal growth structures 11 includes a supporter 11b and a catalyst layer 11a formed on the insulating supporter 11b. The insulating supporter 11b and the catalyst layer 11a are respectively spaced apart from each other by a predetermined interval. According to the current embodiment of the present invention, a nano tube is a Carbon Nano Tube (CNT), and thus the catalyst layers 11a are formed of a well-known CNT growing material (e.g., Fe and Ni alloy). The nano tube horizontal growth structures 11 are formed using photolithography including conventional layer-forming and patterning. The two opposite nano tube horizontal growth structures 11 are for horizontally growing a CNT.

Figure 3C:
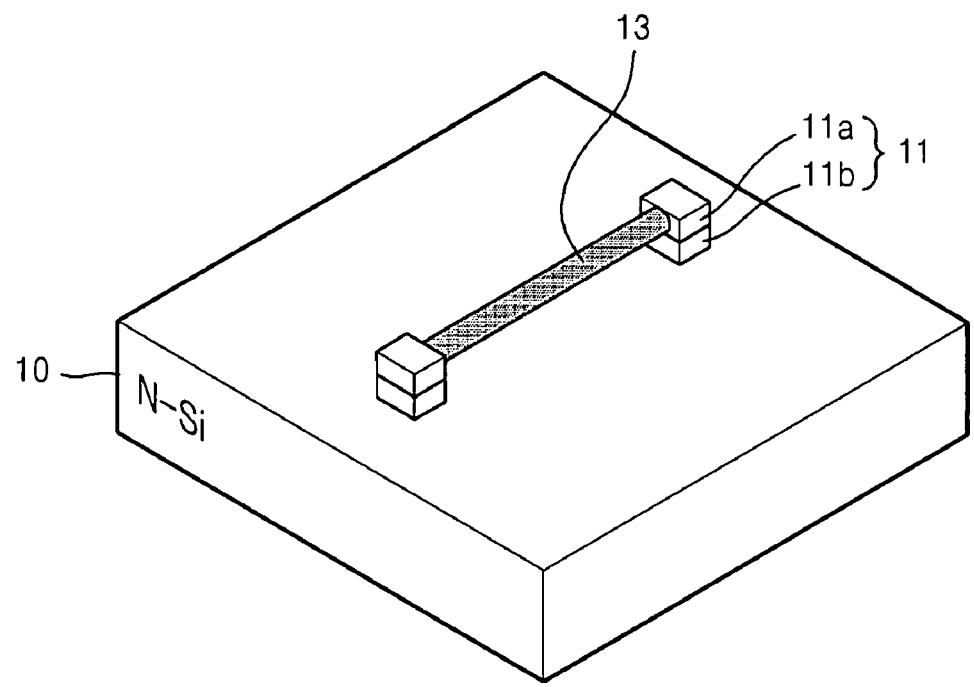

Referring to FIG. 3C, a gate is obtained by horizontally growing a nano tube between the two nano tube horizontal growth structures 11, preferably, a CNT. The CNT is horizontally grown using a CNT growth method suggested by Yuegang Zhang et al., in which a growth direction is controlled by an electric field. {Reference: "Electric-Field-Directed Growth of Aligned Single-Walled Carbon nanotubes", Applied Physics Letters, Volume 79, Number 19, 5 Nov. 2001}.

Figure 3D:
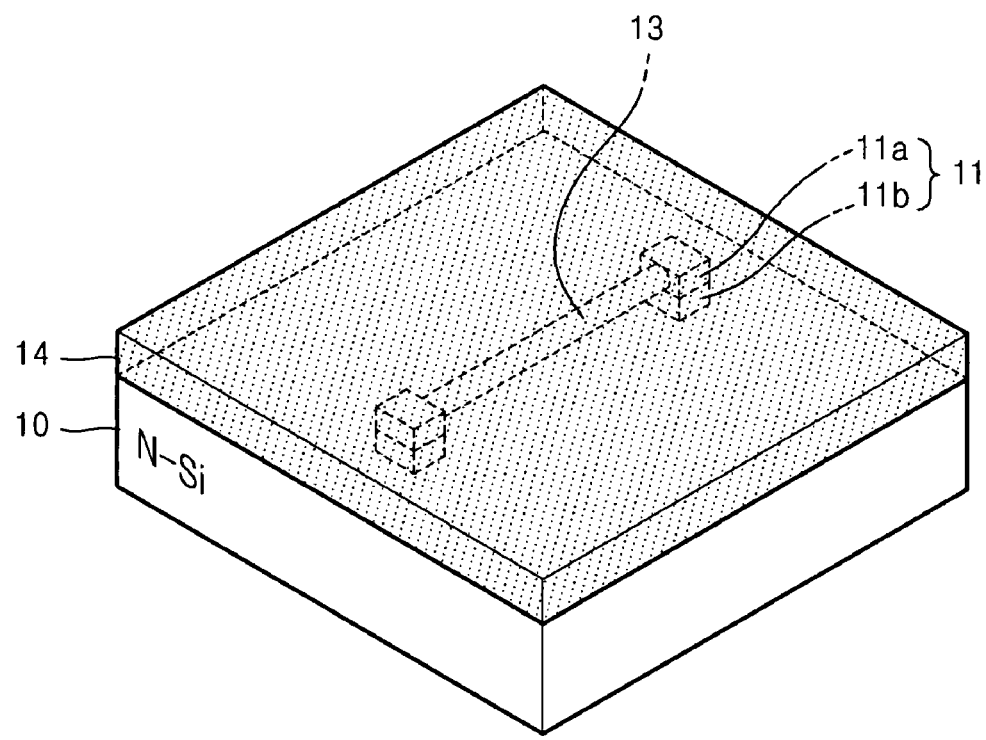
Figure 3E:
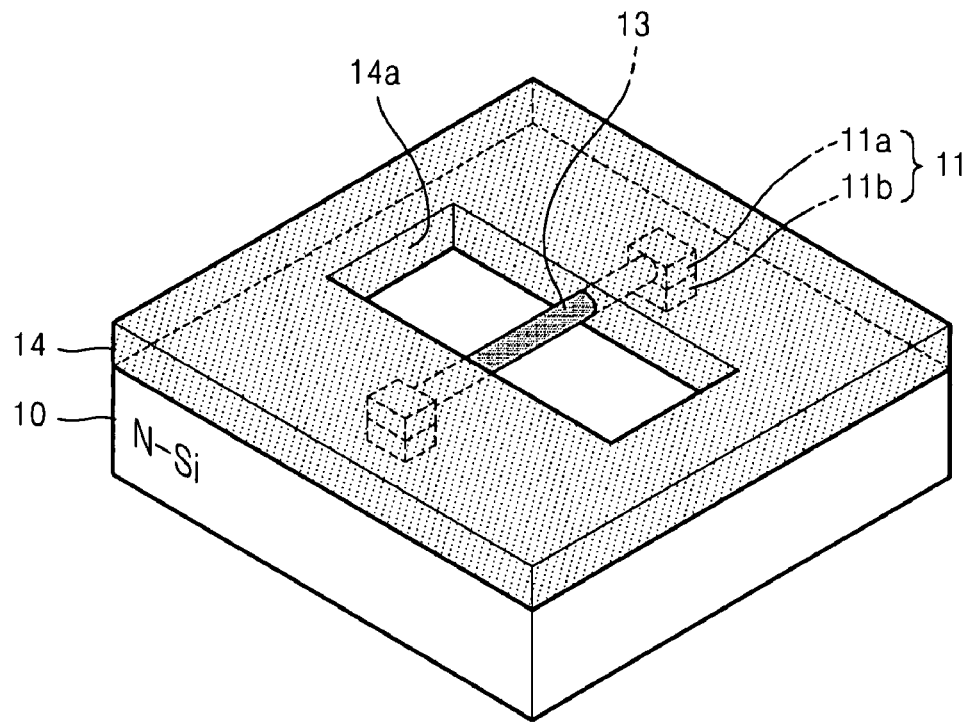

After a photo-resist layer 14 is coated on the N-type substrate 10 on which the gate is formed, as illustrated in FIG. 3D, a window 14a having a predetermined size is formed in the photo-resist layer 14 to traverse the gate using photolithography, as illustrated in FIG. 3E. The window 14a defines a region of the N-type substrate 10 in which a source electrode 12a and a drain electrode 12b are to be formed.

Figure 3F:
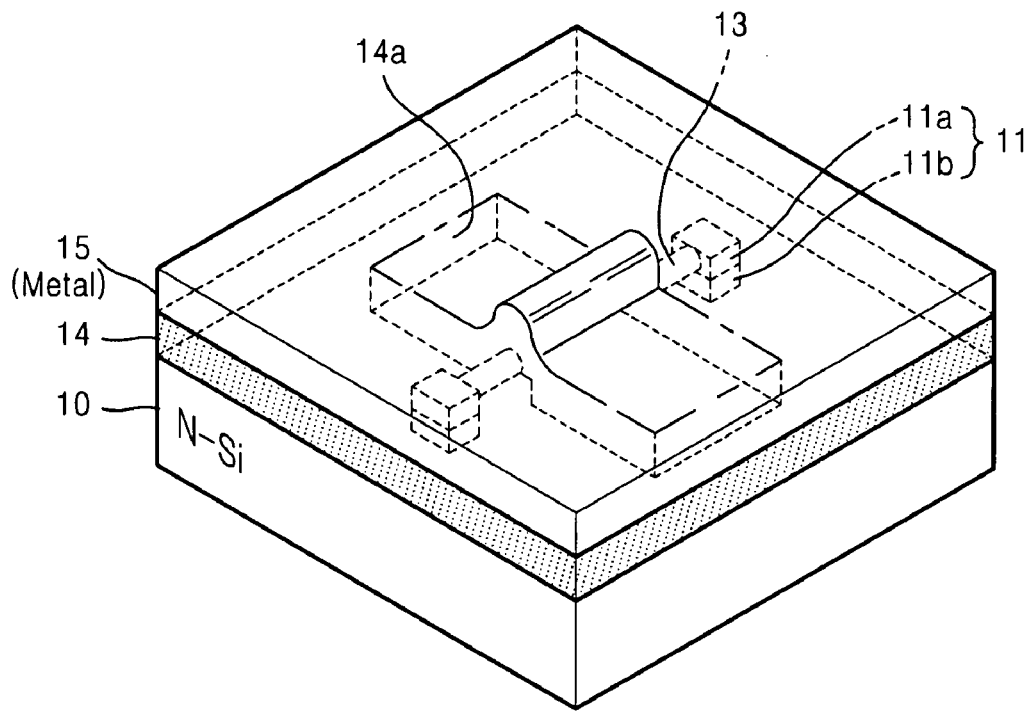

Referring to FIG. 3F, a metal layer 15, which is to be patterned in the source electrode 12a and the drain electrode 12b, is formed on the photo-resist layer 14 using a deposition method or the like.

Figure 3G:
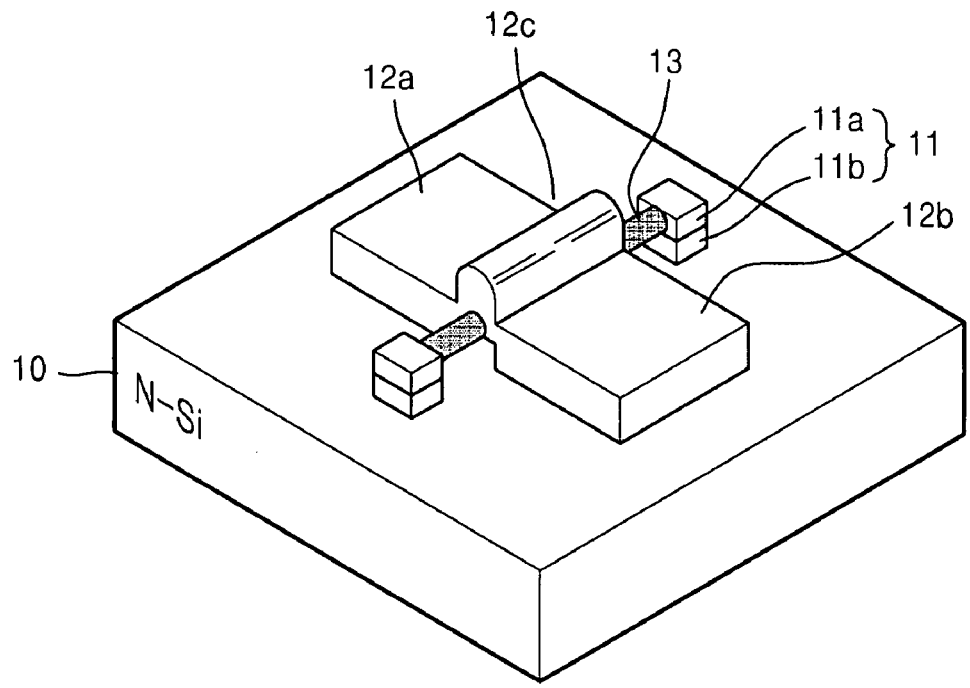

Referring to FIG. 3G, the metal layer 15 is patterned using a lift-off process. When the photo-resist layer 14 is etched, the metal layer 15 formed on the photo-resist layer 14 as well as the photo-resist layer 14 are partially removed, and as such only a portion of the metal layer 15 which is deposited on the n type substrate 10 through the window 14a of the photo-resist layer 14 remains to transverse the gate 13.

Figure 3H:
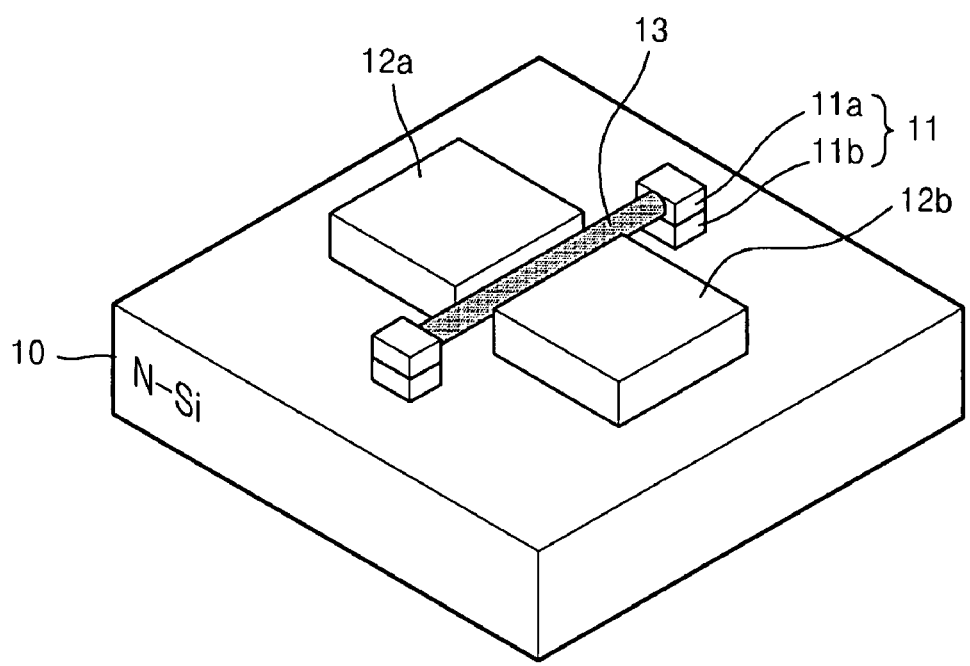

Referring to FIG. 3H, a metal of the remaining metal layer 15, which is deposited on the gate 13, is partially removed to obtain the source electrode 12a and the drain electrode 12b, which are separated from each other on both sides of the gate 13. The source electrode 12a and the drain electrode 12b are separated from each other by removing a metal deposited on the gate using a lift-off process as illustrated in FIG. 3G. The source electrode 12a and the drain electrode 12b are separated from each other based on low adhesion between a CNT and a metal, and a great step difference (deteriorated step coverage) is generated on both sides of the gate. When a metal is not well removed during a photo-resist lift-off process, the metal formed on the gate can be more easily removed by applying supersonic waves to a photo-resist solvent during the photo-resist lift-off process. The metal layer 15 formed on the gate can be also removed by supersonic waves using additional methods.

Figure 3I:
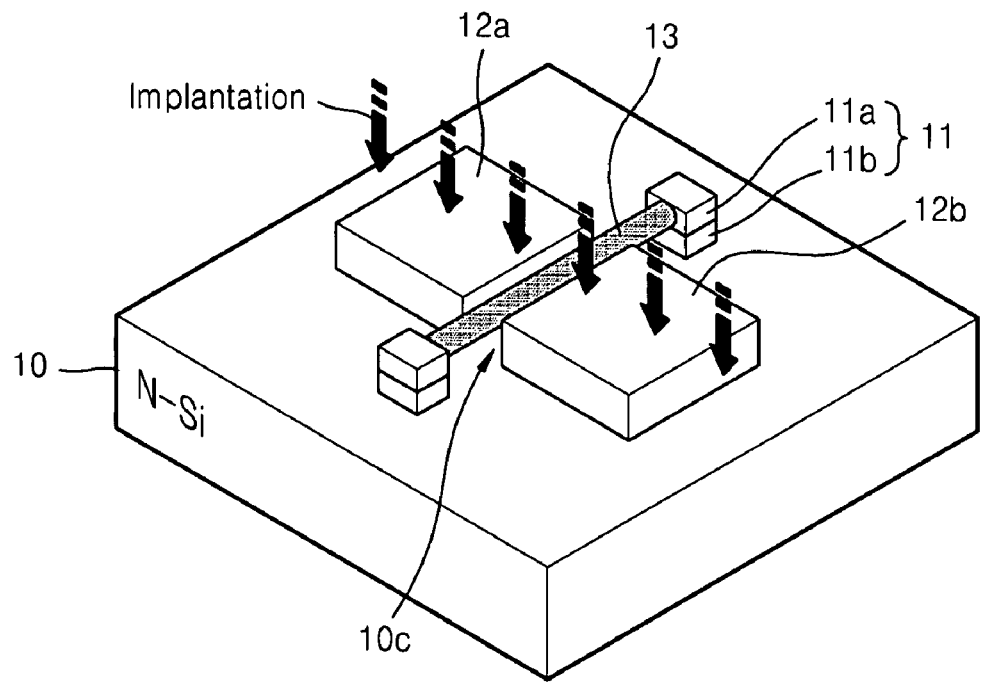
Figure 3J:
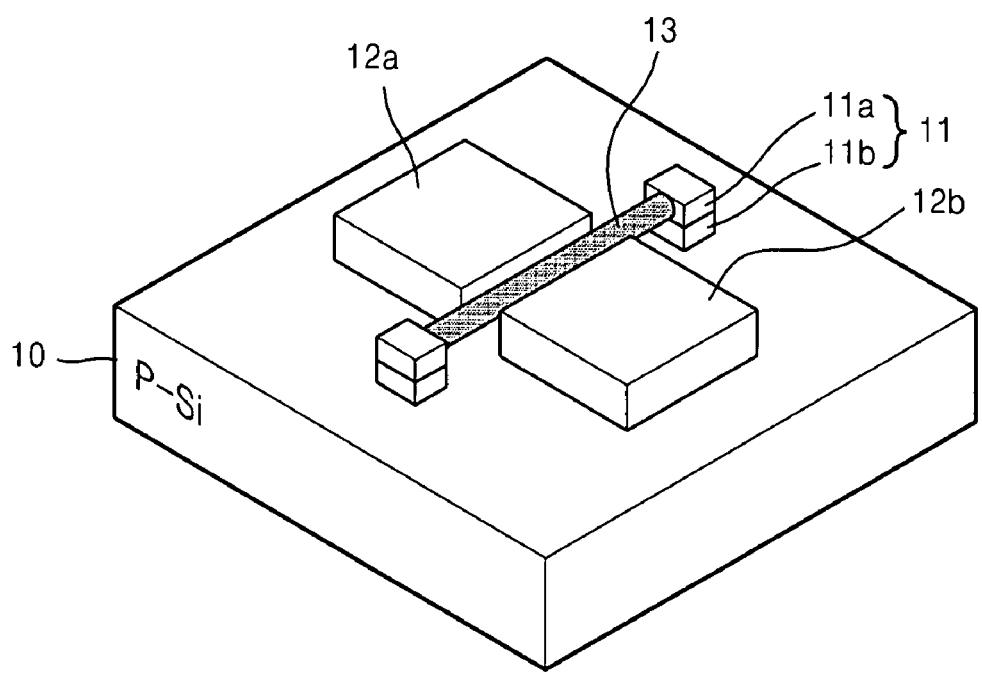

Referring to FIG. 3I, impurity implantation is performed in order to form a channel 10c between an N-type source and a drain as well as in order to isolate the N-type source and the drain. Impurities uses in the impurity implantation are of P-type, and are implanted to all parts which are not covered by the source electrode 12a and the drain electrode 12b obtained from the metal layer 15, in particular, also to a lower portion of the gate 13. Since a CNT has a reticulated structure in which particles are scatteredly spaced, impurities ions can be transmitted through the CNT. By implanting such P-type impurities, all parts, to which impurities are implanted, are changed to have P-types, and as such, lower parts of both of the source electrode 12a and the drain electrode 12b remain constantly of the N-type and are isolated from outside the source electrode 12a and the drain electrode 12b. By implanting such impurities, an NPN type transistor having a gate, which has a shape of an initial stage, can be obtained, as illustrated in FIG. 3J.

After the above processes are performed, a gate insulating layer may be formed between the gate and the channel by depositing an insulating material using CVD or the like. Then, an objective FET is obtained through common processes required for manufacturing a transistor.

Using the above method, the gate 13 is directly formed on the N-type substrate 10 by growing a material for forming the gate 13. However, the gate 13 is also formed using a method in which a CNT is adhered onto the N-type substrate 10 after the CNT is separately formed.

Hereinafter, a method of manufacturing a FET having a CNT as a gate, which is separately formed, will be described, according to another embodiment of the present invention.

Figure 4A:
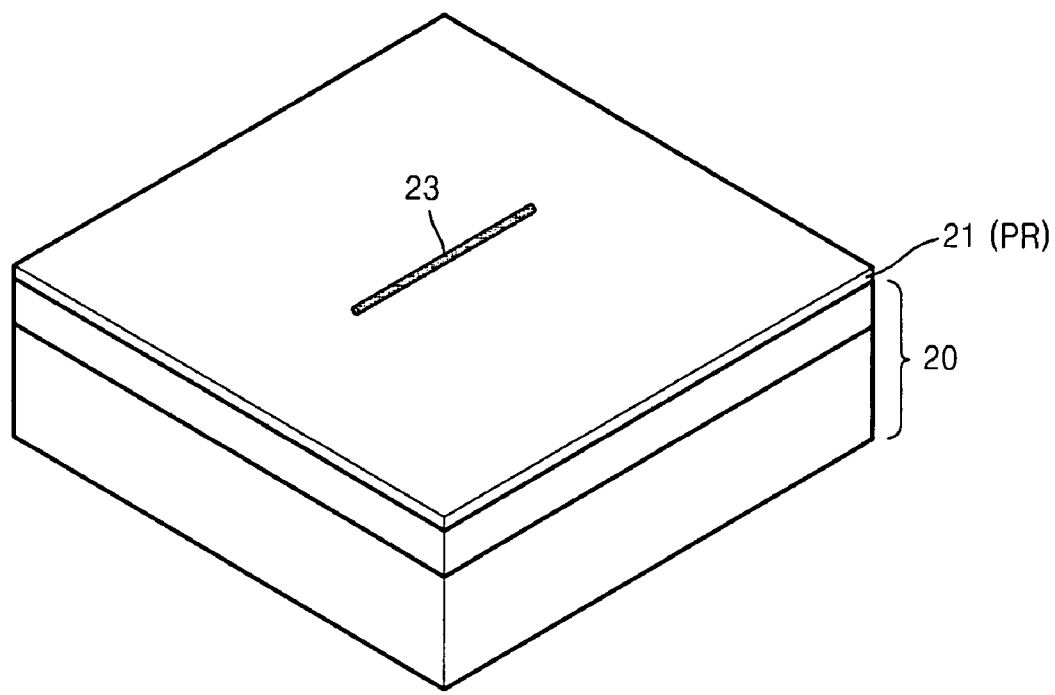
FIGS. 4A through 4E are views of a method of adhering a nano tube to a substrate, which is included in a method of manufacturing a FET, according to another embodiment of the present invention.

Referring to FIG. 4A, a sacrificial layer 21 is formed on a substrate 20. The sacrificial layer 21 may be formed of any material that can be used in order to selectively etch a photo-resist or an electrode material, which will be used in the following processes, for example, a metal, such as Al or a polymer. A CNT 23, which is a composite material synthesized using additional processes, is adhered onto the sacrificial layer 21. Since the CNT 23 is adhered to the sacrificial layer 21 based on Van der Waals force, the CNT 23 is very strongly adhered to the sacrificial layer 21. The CNT 23 is one selected from CNTs formed using a method in which a solvent including CNTs dispersed therein is spin-coated on the sacrificial layer 21, and the CNTs are adhered to the sacrificial layer 21, using an optical microscope, a scanning electron microscope, and so on.

Figure 4B:
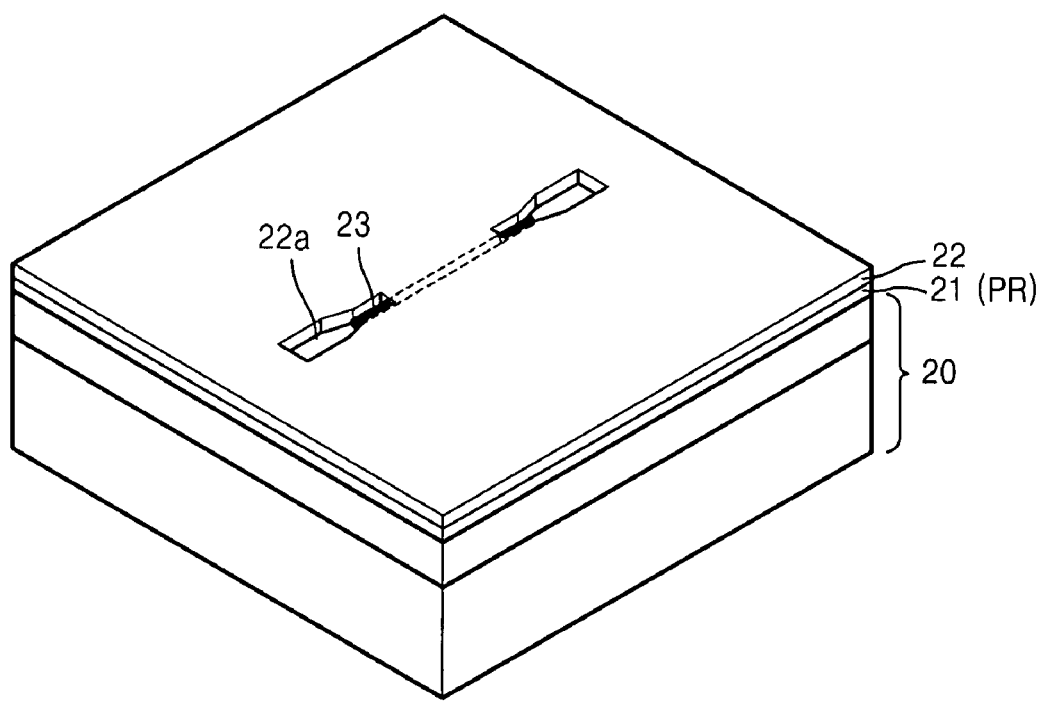

Referring to FIG. 4B, a photo-resist mask 22 is coated to a predetermined thickness on the sacrificial layer 21 to which the CNT 23 is adhered, and then the photo-resist mask 22 is patterned to form a window 22a exposing both ends of the CNT 23. A surface of the sacrificial layer 21 is exposed around a bottom of the window 22a. The window 22a is for forming a source electrode and a drain electrode during subsequent process and have shapes corresponding to the source electrode and the drain electrode.

Figure 4C:
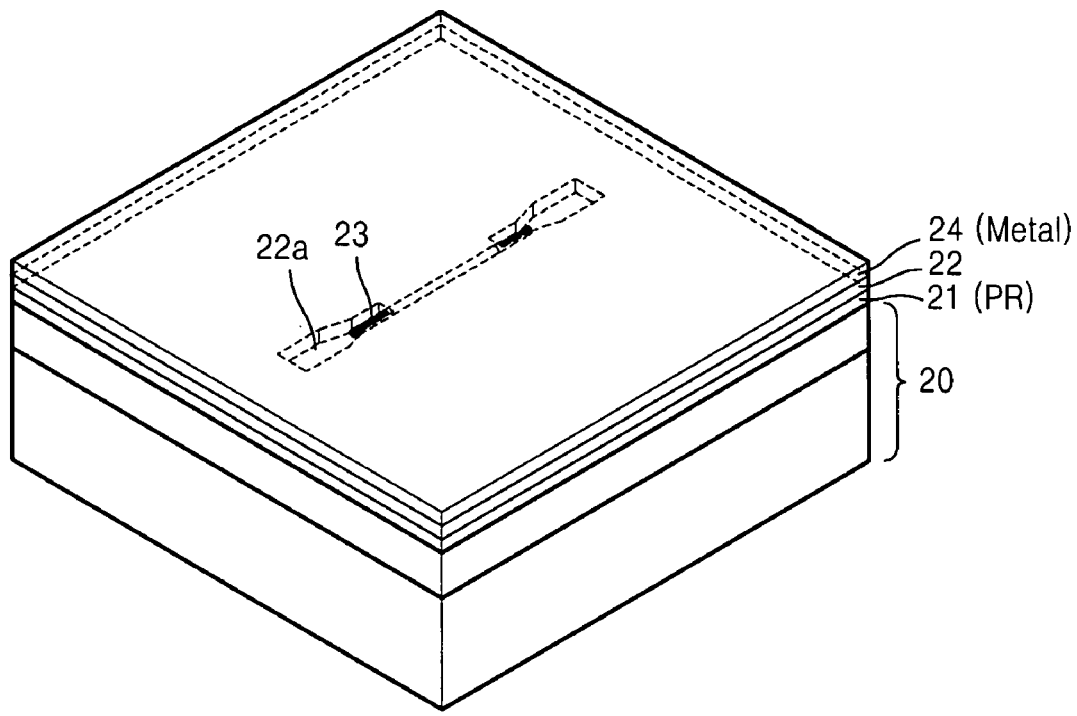

Referring to FIG. 4C, an electrode material layer 24 is formed on the photo-resist mask 22.

Figure 4D:
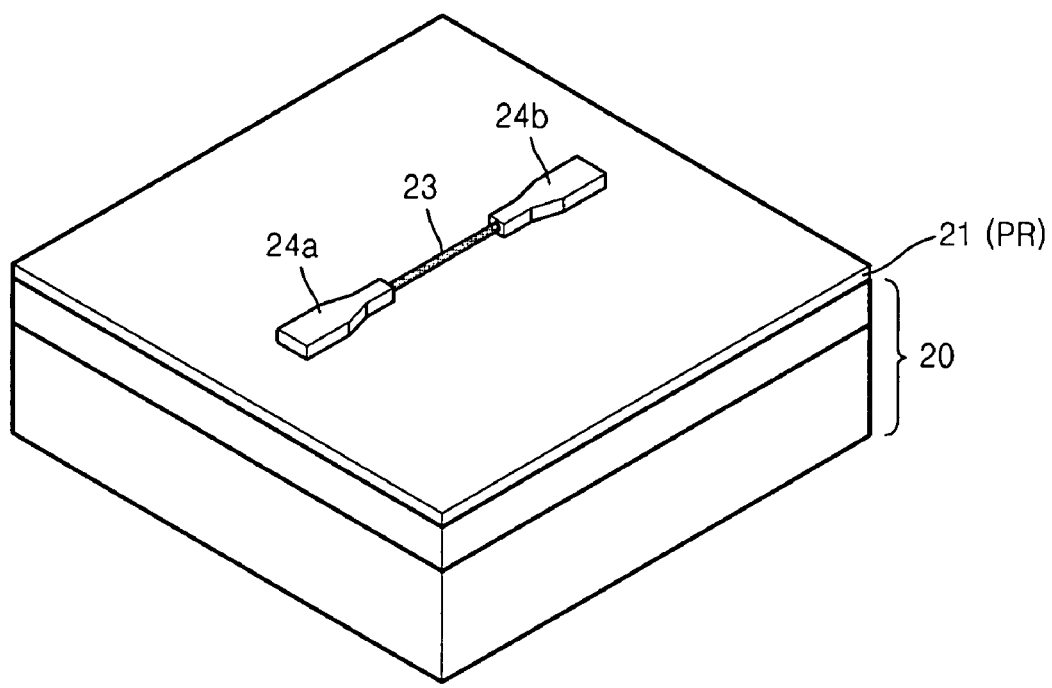

Referring to FIG. 4D, the electrode material layer 24 is patterned using a lift-off process, which is used for removing the photo-resist mask 22, in order to form upper supporting layers 24a and 24b supporting both ends of the CNT 23.

Figure 4E:
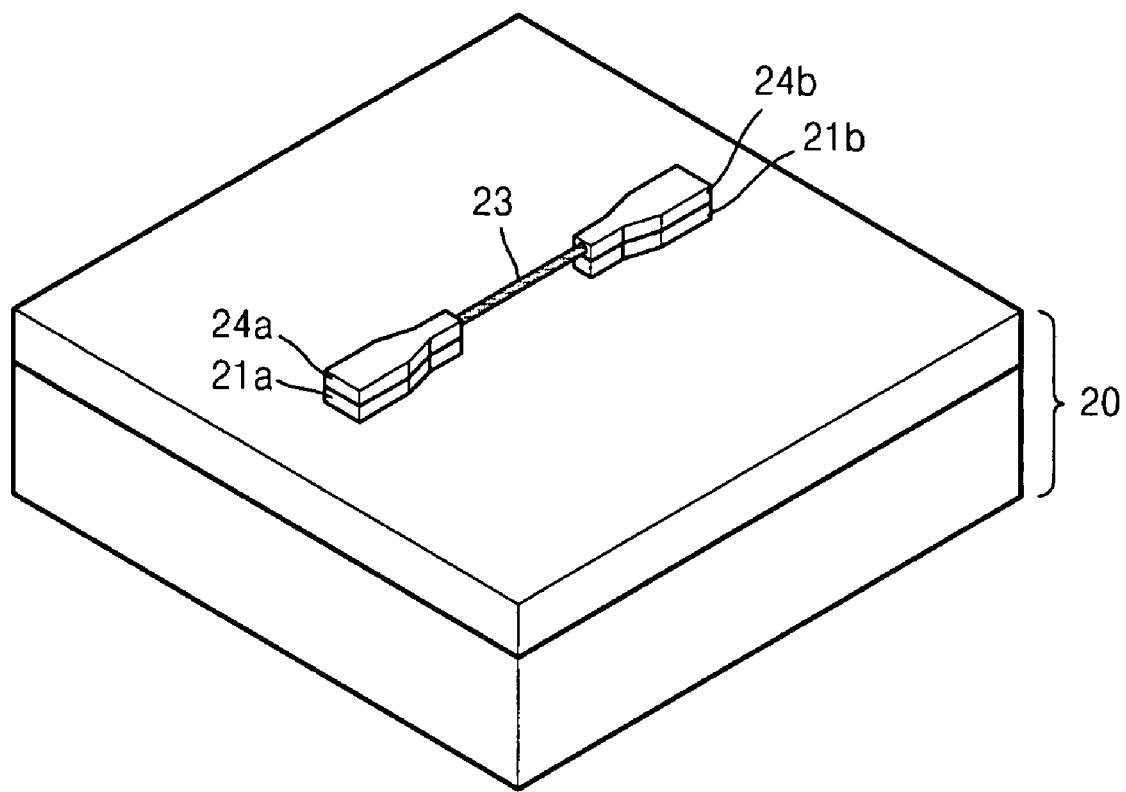

Referring to FIG. 4E, the sacrificial layer 21 disposed below the upper supporting layers 24a and 24b is patterned using the upper supporting layers 24a and 24b obtained from the electrode material layer 24 as a mask. Through these processes, a part of the sacrificial layer 21 remains below the upper supporting layers 24a and 24a as lower supporting layers 21a and 21b supporting the CNT 23. Accordingly, the CNT 23 is spaced from a surface of the substrate 20 to be suspended by the upper and lower supporting layers 24a, 24b, 21a and 21b. The upper supporting layers 24a and 24b, which are disposed on both sides of the CNT 23, and remaining layers 21a and 21b of the sacrificial layer 21, which are respectively disposed below the upper supporting layers 24a and 24b, function as a structure supporting the CNT 23 with respect to the substrate 20.

The CNT 23 is adhered to the substrate 20 through the above processes, and then the method of manufacturing a transistor is performed as described above. After the process of FIG. 4E, the processes of FIGS. 3D through 3J are performed to obtain a desired FET including a gate.

Figure 5A:
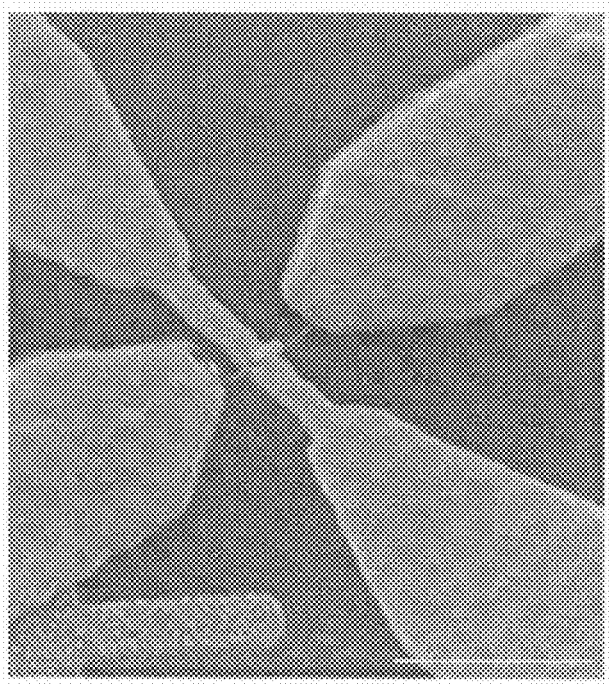
FIGS. 5A and 5B are Scanning Electron Microscope (SEM) images of respective cases just before and just after an electrode material, formed on a CNT functioning as a mask during the manufacturing a FET, is removed.
Figure 5B:
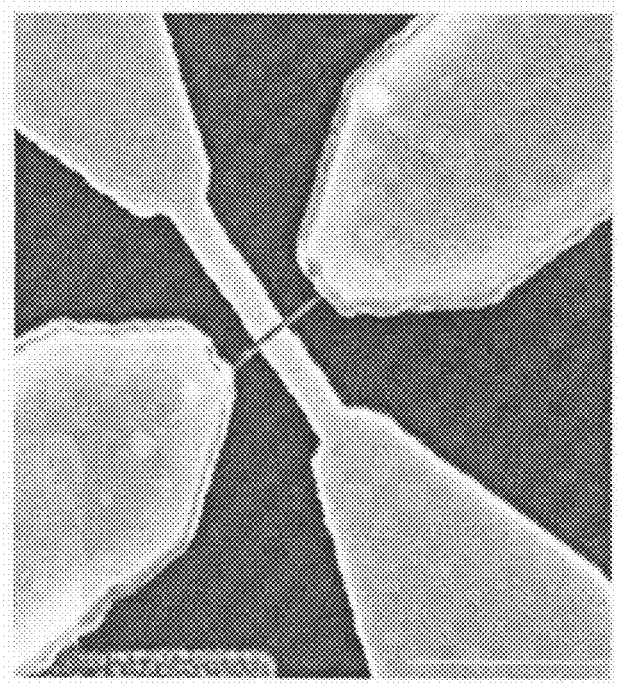

FIGS. 5A and 5B are Scanning Electron Microscope (SEM) images obtained during manufacturing of a thin film transistor including a CNT as a gate. That is, FIG. 5A illustrates the case just before an electrode material, formed on the CNT functioning as a mask during the forming of a source electrode and a drain electrode, is removed, and FIG. 5B illustrates the case after the electrode material is removed, and a gap having a nano size (the length of a channel or an interval between a source and a drain) is successfully formed between the source electrode and drain electrode. Referring to FIGS. 5A and 5B, the source electrode is disposed around a corner of a left upper end, and the drain electrode is disposed around a corner of a right lower end. Supporting structures are disposed around corners of right lower and left upper ends. The real length of a scale bar indicated around a right lower part of FIGS. 5A and 5B is 1.5 μm.

According to the FET of the present invention, a nano tube such as a CNT or the like is used as a gate, and the nano tube is also used as a mask for adjusting an interval between a source and a drain during the manufacturing of the gate. Although a CNT used as a gate has been described as an example of a nano tube in the above embodiments of the present invention, a conductive nano tube formed of different materials can be used. In addition, although two examples have been described as a method of adhering a nano tube to a substrate, the present invention is not limited thereto.

During the manufacturing of a FET, an interval between channels is generally determined according to a limitation of an optical etching technique. Accordingly, the size and the integration of a transistor may be greatly influenced according to how a channel is finely formed, or formed to have a small width. According to the present invention, during the manufacturing of a FET, a CNT is used a mask for forming an electrode and a gate, and thus the number of manufacturing processes can be reduced. In addition, a channel having a length of several tens of nano meters or less can be formed without using a minute optical etching process.

The width of a fine channel is an element which directly influences the mobility improvement and the integration of a transistor. For example, in terms of mobility, the mobility is directly influenced by the width and the length of a channel.

μ∝W/L (W: the width of channel and L: the length of a channel)

According to the present invention, a FET having a channel length in the range of nm can be manufactured without using a minute optical etching process. Accordingly, a FET having high performance can be easily manufactured. In addition, since a CNT, used as a deposition mask during the forming of a source electrode and a drain electrode, is also used as a gate after the source electrode and the drain electrode are formed, additional optical-etching and forming of an electrode material for forming a gate can be omitted.

While the present invention has been particularly shown and described with reference to exemplary embodiments thereof, it will be understood by those of ordinary skill in the art that various modifications in form and detail may be made therein without departing from the spirit and scope of the present invention as defined by the following claims.

What is claimed is:

1. A transistor comprising:
   a semiconductor substrate;
   a channel region formed in the semiconductor substrate;
   a source and a drain respectively disposed in the semiconductor substrate at either side of the channel region;
   a source electrode and a drain electrode disposed on the source and the drain respectively; and
   a conductive nano tube gate arranged on the semiconductor substrate to transverse the channel region between the source and the drain, the conductive nanotube gate has a height smaller than the source electrode and the drain electrodes; and
   wherein the length of the channel region corresponds to a distance between the source electrode and the drain electrode, and the length of the channel region is determined by the diameter of the conductive nanotube gate.

2. The transistor of claim 1, wherein the conductive nano tube gate comprises a Carbon Nano Tube (CNT).

3. The transistor of claim 1, wherein the gate is supported by a support structure arranged on the substrate.

4. A method of manufacturing a transistor, the method comprising:
   arranging a conductive nano tube gate on a surface of a semiconductor substrate;
   defining source and drain regions having predetermined sizes and traversing the nano tube gate;
   forming a metal layer on the source, drain region, and on the nano tube gate between the source and the drain region;
   removing a portion of the metal layer formed on the nano tube gate to respectively form source and drain electrodes, the source and drain electrodes being apart from the nano tube gate; and
   doping a channel region below the nano tube gate arranged between the source and drain electrodes by ion-implanting.

5. The method of claim 4, wherein the source and the drain regions are defined by forming a photo-resist layer on a substrate on which the nano tube gate is arranged, the photo-resist layer including a window having a size and a location corresponding to the size and the location of a region on which the source and the drain are formed.

6. The method of claim 5, wherein the nano tube gate is formed using a horizontal growth method with respect to the substrate.

7. The method of claim 5, wherein the nano tube gate is synthesized and then adhered to the substrate by a supporting structure.

8. The method of claim 5, wherein forming the metal layer comprises:
   depositing a metal material on the photo-resist layer to form the metal layer on the source and the drain regions defined by the window; and
   leaving the metal layer just on the source and the drain regions by removing the photo-resist layer and a part of the metal material deposited on the photo-resist layer.

9. The method of claim 8, wherein the nano tube gate is formed using a horizontal growth method with respect to the substrate.

10. The method of claim 8, wherein the nano tube gate is synthesized and then adhered to the substrate by a supporting structure.

11. The method of claim 8, wherein forming the source and the drain electrodes comprises:
    removing a portion of the metal layer remaining on the nano tube gate to form the source and the drain electrodes respectively arranged on either side of the nano tube gate.

12. The method of claim 11, wherein the nano tube gate is formed using a horizontal growth method with respect to the substrate.

13. The method of claim 11, wherein the nano tube gate is synthesized and then adhered to the substrate by a supporting structure.

14. The method of claim 5, wherein forming the source and the drain electrodes comprises:
    removing a portion of the metal layer remaining on the nano tube gate to form the source and the drain electrodes respectively arranged on either side of the nano tube gate.

15. The method of claim 14, wherein the nano tube gate is formed using a horizontal growth method with respect to the substrate.

16. The method of claim 14, wherein the nano tube gate is synthesized and then adhered to the substrate by a supporting structure.

17. The method of claim 4, wherein forming the source and the drain electrodes comprises:
    removing a portion of the metal layer remaining on the nano tube gate to form the source and the drain electrodes respectively arranged on either side of the nano tube gate.

18. The method of claim 17, wherein the nano tube gate is formed using a horizontal growth method with respect to the substrate.

19. The method of claim 17, wherein the nano tube gate is synthesized and then adhered to the substrate by a supporting structure.

20. The method of claim 4, wherein the nano tube gate is formed using a horizontal growth method with respect to the substrate.

21. The method of claim 20, wherein the nano tube gate comprises a Carbon Nano Tube (CNT).

22. The method of claim 4, wherein the nano tube gate is synthesized and then adhered to the substrate by a supporting structure.

23. The method of claim 22, wherein the nano tube gate comprises a Carbon Nano Tube (CNT).

24. The method of claim 4, wherein the nano tube gate comprises a Carbon Nano Tube (CNT).

25. A transistor comprising:
    a semiconductor substrate;
    a channel region formed in the semiconductor substrate;
    a source and a drain respectively being in the semiconductor substrate on either side of the channel region;

a source electrode and a drain electrode disposed on the source and the drain respectively; and a conductive nano tube gate arranged on the semiconductor substrate to transverse the channel region between the source and the drain, the conductive nano tube gate being suspended over the semiconductor substrate, wherein the length of the channel region is determined by the diameter of the conductive nano tube gate, and wherein the conductive nano tube gate has a height smaller than the source electrode and the drain electrode.

26. The transistor of claim 25, wherein the conductive nano tube gate is supported by support structures formed on both sides of the conductive nano tube gate.

* * * * *